United States Patent
Karimi et al.

(10) Patent No.: US 10,476,379 B2
(45) Date of Patent: Nov. 12, 2019

(54) AIRCRAFT UNIVERSAL POWER CONVERTER

(71) Applicant: The Boeing Company, Chicago, IL (US)

(72) Inventors: Kamiar Karimi, Kirkland, WA (US); Shengyi Liu, Sammamish, WA (US); Duanyang Wang, Mountain View, CA (US); Francisco de Leon, Ridgewood, NJ (US); Qingquan Tang, Kingston, PA (US); Dazhong Gu, Brooklyn, NY (US); Dariusz Czarkowski, South Setauket, NY (US); Kerim Colak, Brooklyn, NY (US); Mariusz Bojarski, Bronx, NY (US)

(73) Assignee: The Boeing Company, Chicago, IL (US)

( * ) Notice: Subject to any disclaimer, the term of this patent is extended or adjusted under 35 U.S.C. 154(b) by 359 days.

(21) Appl. No.: 15/359,400

(22) Filed: Nov. 22, 2016

(65) Prior Publication Data
US 2017/0072882 A1 Mar. 16, 2017

Related U.S. Application Data

(62) Division of application No. 13/945,511, filed on Jul. 18, 2013, now Pat. No. 9,533,638.

(51) Int. Cl.
*H02M 1/44* (2007.01)
*B60R 16/033* (2006.01)
(Continued)

(52) U.S. Cl.
CPC .............. *H02M 1/44* (2013.01); *B60R 16/033* (2013.01); *B64D 41/00* (2013.01);
(Continued)

(58) Field of Classification Search
None
See application file for complete search history.

(56) References Cited

U.S. PATENT DOCUMENTS 6,272,023 B1 * 8/2001 Wittenbreder .... H02M 3/33592
363/16
7,423,894 B2 * 9/2008 Ilic ...................... H02M 3/1584
363/132
(Continued)

FOREIGN PATENT DOCUMENTS

CN 1843677 10/2006
CN 103036435 4/2013
(Continued)

OTHER PUBLICATIONS

Office Action concerning Chinese Patent Application No. 201410344706.X dated Jun. 15, 2018.
(Continued)

*Primary Examiner* — Thienvu V Tran
*Assistant Examiner* — David M Stables
(74) *Attorney, Agent, or Firm* — Kunzler Bean & Adamson

(57) ABSTRACT

A power supply system suitable for use by an aircraft is disclosed. The power system converts power from an unregulated DC power source to multiple AC and DC voltage outputs. The power supply system comprises an interleaved buck converter, and interleaved full-bridge converter, an interleaved inverter, and a control system. In one configuration, the interleaved inverter uses high-voltage DC generated by the interleaved four-bridge converter as its power input to generate a high-voltage AC output.

20 Claims, 8 Drawing Sheets

(51) Int. Cl.

| | | |
|---|---|---|
| *H02M 3/158* | (2006.01) | |
| *H02M 7/493* | (2007.01) | |
| *B64D 41/00* | (2006.01) | |
| *H02M 3/335* | (2006.01) | |
| *H03H 7/42* | (2006.01) | |

(52) U.S. Cl.
CPC ..... *H02M 3/1584* (2013.01); *H02M 3/33546* (2013.01); *H02M 7/493* (2013.01); *H03H 7/427* (2013.01); *B64D 2041/005* (2013.01); *B64D 2221/00* (2013.01); *H02M 2003/1586* (2013.01); *Y10T 307/406* (2015.04)

(56) References Cited

U.S. PATENT DOCUMENTS

| | | | |
|---|---|---|---|
| 8,736,102 | B1 | 5/2014 | Gao et al. |
| 8,964,432 | B2 | 2/2015 | Tang et al. |
| 9,048,726 | B1 | 6/2015 | Tang et al. |
| 2008/0123375 | A1 | 5/2008 | Beardsley |
| 2012/0232728 | A1* | 9/2012 | Karimi ............... H02J 3/38 701/22 |
| 2013/0083563 | A1 | 4/2013 | Wang et al. |

FOREIGN PATENT DOCUMENTS

| | | |
|---|---|---|
| JP | 2001-119856 | 4/2001 |
| JP | 2006296185 | 10/2006 |
| JP | 2009160262 | 7/2009 |
| JP | 2013-081362 | 5/2013 |
| JP | 2013124097 | 6/2013 |

OTHER PUBLICATIONS

Office Action concerning Japanese Patent Application No. 2014-043490 dated Jul. 17, 2018.
Extended European Search Report, Patent Application No. 14177338.2 dated Apr. 15, 2015.
Office Action for Chinese Patent Application No. 201410344706.X dated Sep. 28, 2017.
Japanese Office Action with English translation of Japanese Patent Application No. 2014-143490 dated Mar. 13, 2018.
English translation of Japanese Patent Application JP H3-106876.

* cited by examiner

AIRCRAFT UNIVERSAL POWER CONVERTER

BACKGROUND

Using low-voltage, unregulated DC output power from fuel cells or other unregulated power sources in distributed power systems for aircraft is an emerging technology. Current aircraft power system use a centralized power generation system, such as engine driven generators, with typical voltages of 115 VAC or 230 VAC. Emergency backup power sources of the aircraft may use low-voltage batteries. However, such backup power systems do not use power converters since the batteries are only employed to support local power buses.

Fuel cells may be used as auxiliary electric power sources on aircrafts to deliver localized and/or peak power. They may also be used as a source of emergency power. However, a fuel cell provides an unregulated DC voltage which varies with the load by as much as 50% from low-load to full-load operation. Therefore, fuel cells alone are not a valid substitute for the engine driven generators used in current aircraft since they are incapable of providing various levels and configurations of DC and AC voltages.

SUMMARY

A power supply system suitable for use by an aircraft is disclosed. The power system is configured to convert power from an unregulated DC power source, such as a fuel cell, to multiple AC and DC voltage outputs. The power supply system comprises an interleaved buck converter, and interleaved full-bridge converter, an interleaved inverter, and a control system. The interleaved buck converter is configured to use power of the DC power source to generate a regulated low-voltage DC output. The interleaved full-bridge converter is configured to use power of the DC power source to generate a high-voltage DC output. The interleaved inverter is configured to use power of the unregulated DC power source to generate a high-voltage AC output. The control system is configured to control the interleaved buck converter to generate the regulated low-voltage DC output, the interleaved full-bridge converter to generate the high-voltage DC output, and the interleaved inverter to generate high-voltage AC output. In one configuration, the interleaved inverter uses the high-voltage DC output of the interleaved four-bridge converter as its power input to generate the high-voltage AC output.

DETAILED DESCRIPTION

Figure 1:
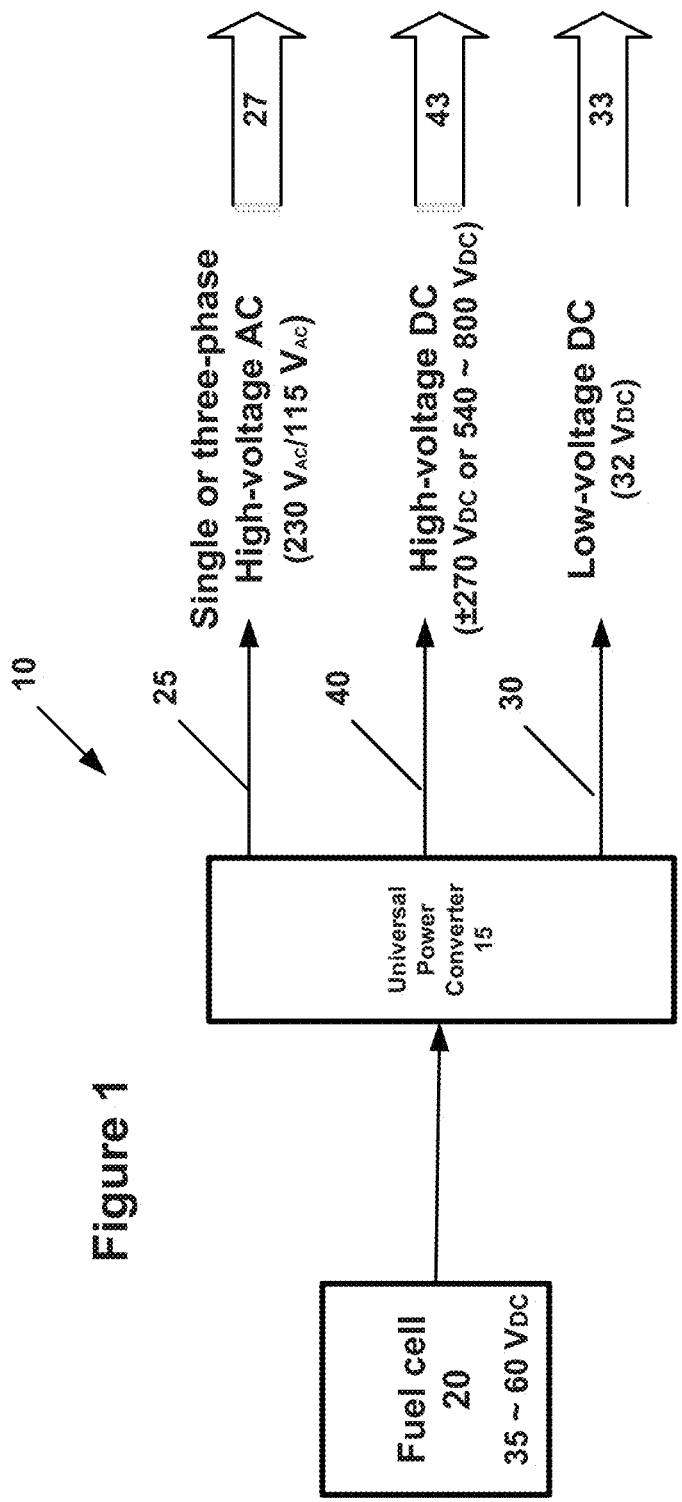
FIG. 1 is a block diagram of a power system suitable for an aircraft.

FIG. 1 is a block diagram of a power system 10 suitable for an aircraft. The power system 10 is not limited to aircraft, however, and may be used in a variety of environments in which an unregulated DC power source is used to generate a plurality of regulated AC and DC power outputs.

In the power system 10 of FIG. 1, a universal power converter 15 is configured to receive unregulated DC power from a DC power source, such as a fuel cell 20. Such fuel cells often provide an unregulated DC voltage of between 35-60 $V_{DC}$. The universal power converter 15 may be formed from a plurality of individual supply units integrated as a single power supply conversion unit.

The universal power converter 15 is configured to convert unregulated low-voltage DC output power provided by the DC power source, such as a fuel cell 20, to a plurality of regulated aircraft voltages, including AC and DC voltage outputs. Here, the high-voltage AC is provided at supply output 25 and may be a single-phase output or three-phase output depending on the configuration of the corresponding supply unit. When configured for an aircraft, the high-voltage AC at supply output 25 may be single-phase 230 VAC, three-phase 230 $V_{AC}$, single-phase 115 $V_{AC}$, or three-phase 115 $V_{AC}$. In each instance, the high-voltage AC of the aircraft may have a frequency of about 400 Hz. The high-voltage AC at supply output 25 is distributed to other portions of the aircraft on high-voltage AC power bus 27.

There are two regulated DC voltages provided by the universal power converter 15. Low-voltage regulated DC is provided at supply output 30, and may be approximately 32 $V_{DC}$ when used in an aircraft power system. The low-voltage DC at supply output 30 is distributed to other portions of the aircraft on low-voltage DC power bus 33. High-voltage DC is provided at supply output 40. In an aircraft, the high-voltage DC may have multiple DC voltage levels. For example, the high-voltage DC may be at a level of +/−$V_{DC}$ with respect to a common level. Various aircraft use voltage levels of approximately +/−270 $V_{DC}$. Or the high-voltage DC may be at a voltage level between about 540-800 $V_{DC}$ end-to-and without reference to common. The high-voltage DC at supply output 40 is distributed to other portions of the aircraft on high-voltage DC power bus 43.

Figure 2:
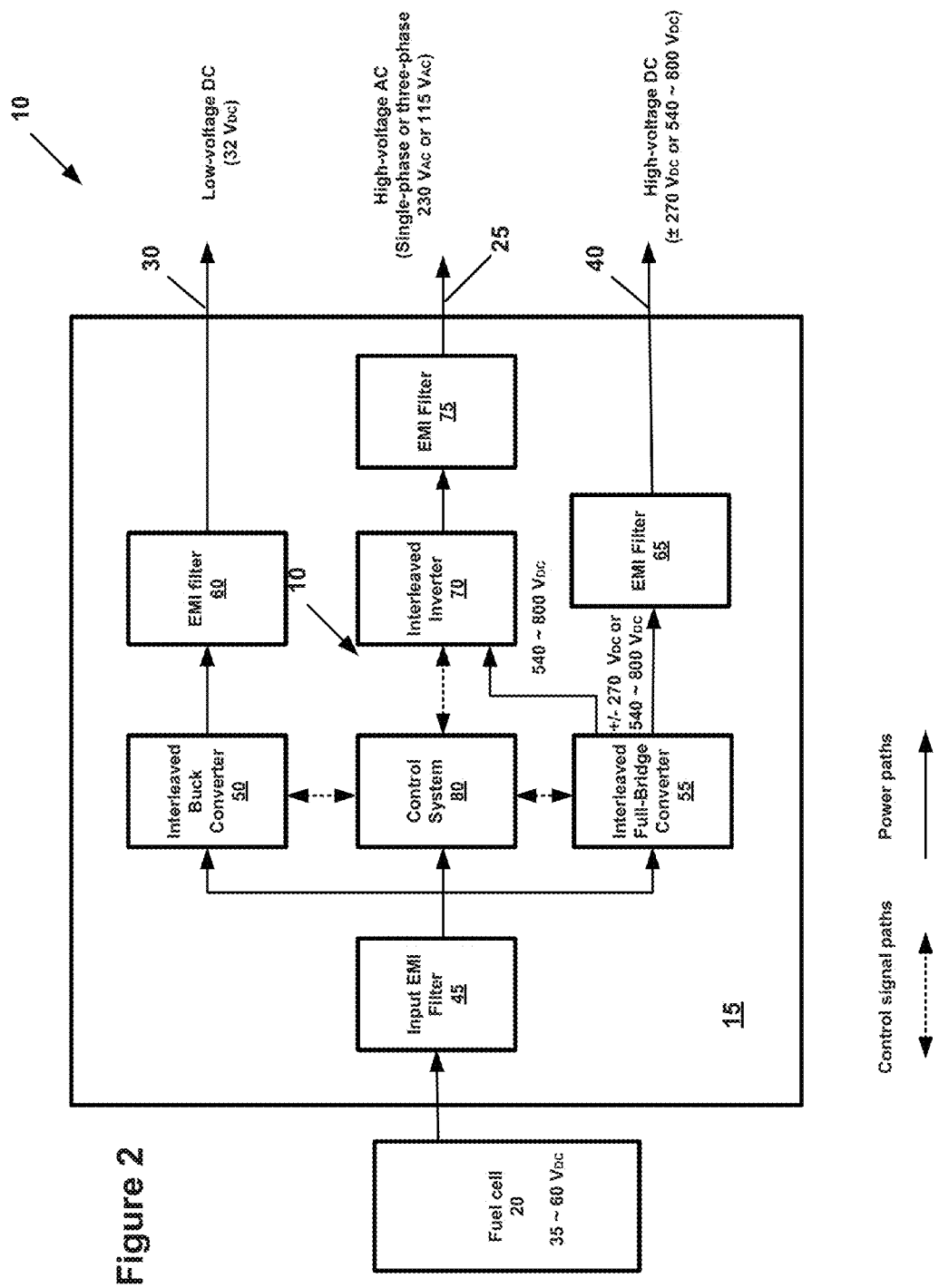
FIG. 2 is a block diagram of one example of a universal power converter.

One example of a universal power converter 15 is shown in the block diagram of FIG. 2. All of the individual supply units in FIG. 2 have interleaved topologies, which facilitates supply unit isolation. Interleaved structures also help to reduce drawing of high frequency current pulses from the fuel cell, which otherwise degrade its performance and reduces its life span. The interleaved structures further allow a reduction in the sizes of the EMI filters used for each supply unit so that the universal power converter 15 can meet strict aircraft emission requirements. Still further, the weight of the universal power converter 15 is relatively low when interleaved structures for the individual supply units are used.

In FIG. 2, the output of the fuel cell 20 is provided to the input of an EMI filter 45. The output of the EMI filter 45 is common to both an interleaved buck converter 50 and an interleaved full-bridge converter 55. Although not required, using a single EMI filter 45 for the interleaved buck converter 50 and interleaved full-bridge converter 55 cuts back on the number of components employed in the universal power converter 15. This reduces its complexity and also results in a low weight. Reduction in the weight of the universal power converter 15 may be desirable in an aircraft.

Figure 3:
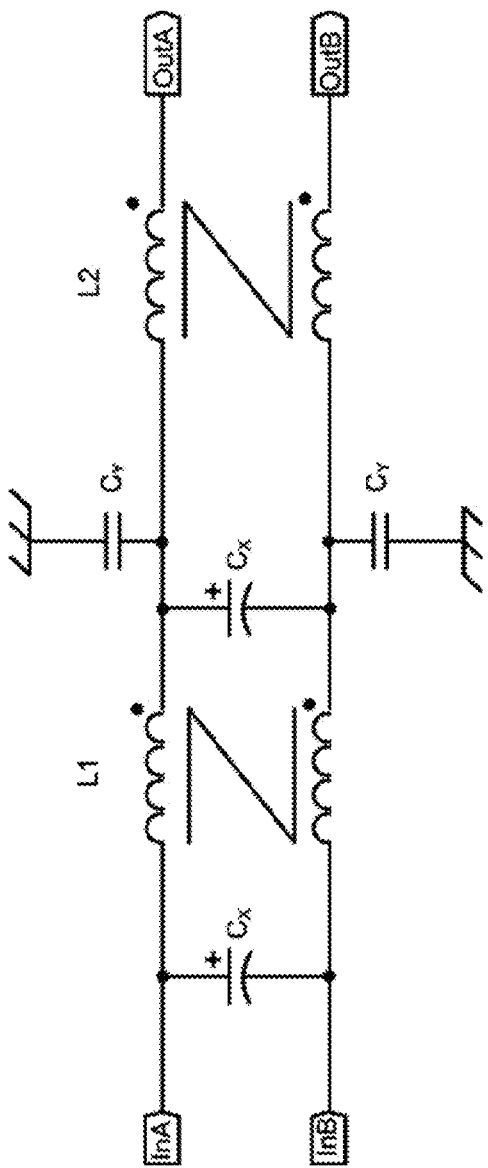
FIG. 3 shows one example of the construction of the EMI filter shown in FIG. 2.

One example of a construction for EMI filter 45 is shown in FIG. 3. EMI filter 45 cleans the unwanted noises from a fuel cell 20. While the capacitors $C_X$ and EMI filter chokes' L1 and L2 leakage inductances limit differential mode noises, line-to-ground capacitors $C_Y$ eliminate common-mode noises.

Referring again to FIG. 2, the interleaved buck converter 50 provides regulated low-voltage DC to supply output 30 through a corresponding EMI filter 60. Again, in an aircraft, the regulated low-voltage DC may be about 32 $V_{DC}$.

The interleaved full-bridge converter 55 uses the DC power at the output of EMI filter 45 to generate high-voltage DC for provision at supply output 40. The high-voltage DC may be at $+/-V_{DC}$ with respect to a common center reference, or a higher DC voltage end-to-end without reference to common. When the universal power converter 15 is used on an aircraft, the high-voltage DC may be approximately $+/-270$ VDC with respect to common. Or the high-voltage DC may be between about 540-800 $V_{DC}$ end-to-end. The output of the interleaved full-bridge converter 55 may be passed to the input of an EMI filter 65 which provides the high-voltage DC to supply output 40.

A high-voltage interleaved inverter 70 is configured to convert high-voltage DC at its input to single-phase or three-phase high-voltage AC at its output, depending on the configuration of the interleaved inverter. In this example, the high-voltage AC may be controlled so that it is either at a first voltage level or a second voltage level. In FIG. 2, the first voltage level is approximately 115 $V_{AC}$, while the second voltage level is higher at approximately 230 $V_{AC}$. Here, the second voltage level is approximately twice that of the first voltage level for use in an aircraft. As shown, the output of the interleaved inverter 70 is provided to the input of a further EMI filter 75, which provides the high-voltage AC to supply output 40 of the universal power converter 15.

The universal power converter 15 also includes a control system 80. The control system 80 is configured to control: 1) the interleaved buck converter 50 to generate the regulated low-voltage DC; 2) the interleaved full-bridge converter 55 to generate the high-voltage DC; and 3) the interleaved inverter 70 to generate the high-voltage AC. Since all of these units are interleaved supply units, the control system 80 may readily configure the voltage output levels and the AC phases provided by the units to match the needs of the loads on the power buses. This may be accomplished by directing the control system 80 to make adjustments to the PWM control signals for each supply unit to effectively turn the supply unit on or off, and change the voltage level at its output.

Figure 4:
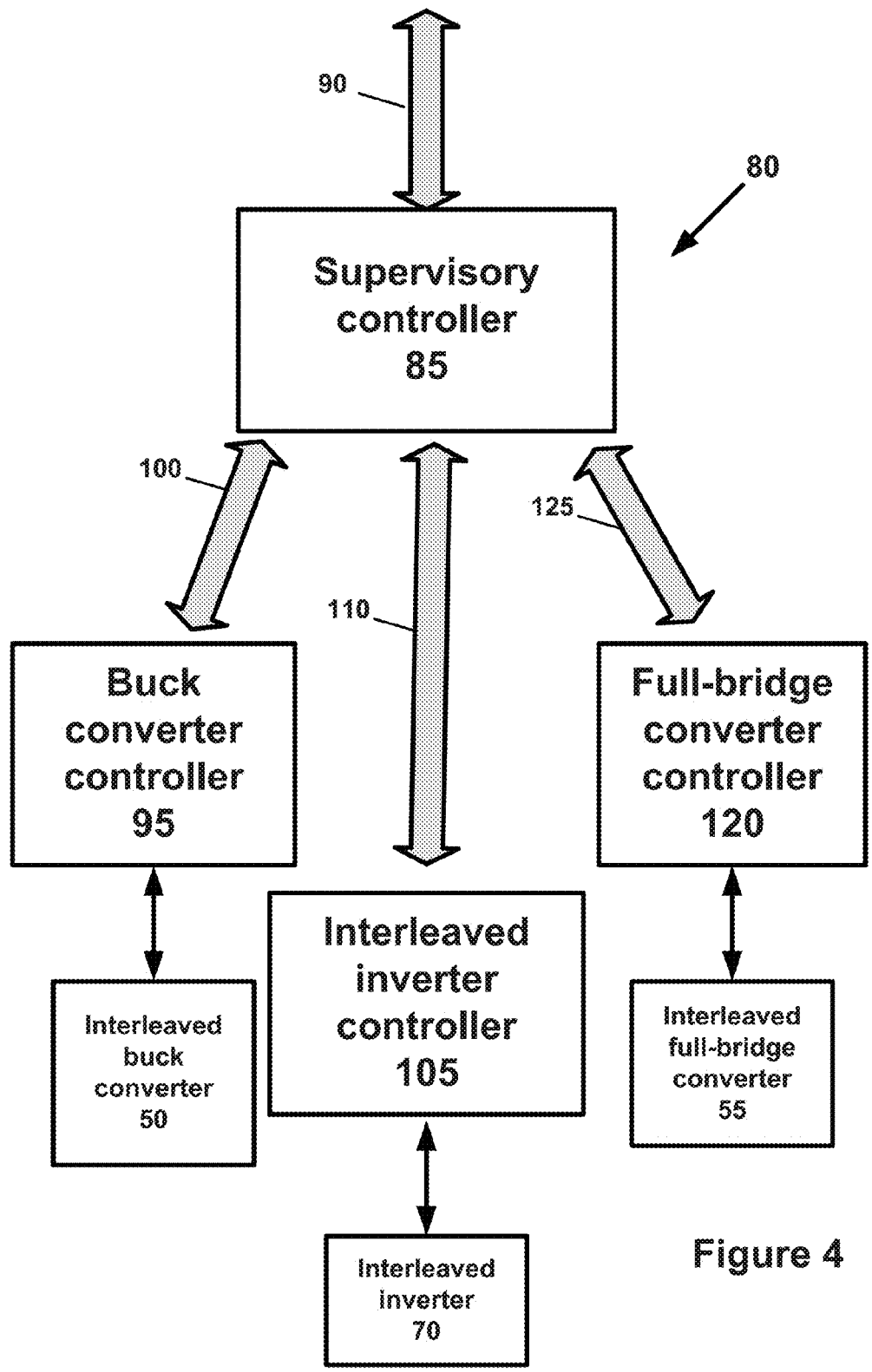
FIG. 4 is a block diagram of a control system that may be used in the universal power converter shown in FIG. 2.

FIG. 4 is a block diagram of the control system 80. The system architecture is functionally divided into four units; a supervisory controller 85; a buck converter controller 95 (first controller); a full-bridge converter controller 120 (second controller); and an inverter controller 105 (third controller). The implementation of the control system 80 can be made on a single microcontroller chip, a computer, or multiple chips.

In this example, a supervisory controller 85 responds to a plurality of system control signals to control operation of the first, second, and third controllers. More particularly, the supervisory controller 85 receives control signals 90 from other aircraft systems. The control signals 90 may correspond, for example, to the detected needs of the loads on the aircraft power buses 27, 33, and 43. Additionally, the control signals 90 may correspond to manual operation of switches in, for example, the aircraft cockpit.

The supervisory controller 85 communicates with the individual controllers respectively associated with each supply unit. The control signals provided by the supervisory controller 85 may be used by the individual controllers to turn the respective supply unit on and off, and set the voltage output level of the supply unit.

The communication paths between the supervisory controller 85 and the other supply unit controllers are illustrated in FIG. 4. As shown, buck converter controller 95 receives control signals from the supervisory controller 85 along communication path 100, where they are used by the buck converter controller 95 to generate the PWM control signals to control the interleaved buck converter 50. Interleaved inverter controller 105 receives control signals from the supervisory controller 85 along communication path 110, where they are used by the interleaved inverter controller 105 to generate the PWM control signals that control operation of the interleaved inverter 70. Full-bridge converter controller 120 receives control signals from the supervisory controller 85 along communication path 125, where they are used by the full-bridge converter controller 120 to generate the PWM control signals that control operation of the interleaved full-bridge converter 55.

Referring to FIG. 2, the universal power converter 15 is implemented to reduce the number of supply units employed to obtain the supply output voltages. To this end, the output of the interleaved full-bridge converter 55 is provided to both the input of the interleaved inverter 70 and to supply output 40. However, the high-voltage AC at supply output 25 and high-voltage DC at supply output 40 are provided in a mutually exclusive manner.

In a first operational mode, the aircraft power system is configured so that the universal power converter 15 supplies low-voltage DC (e.g., 32 $V_{DC}$) at supply output 30, and high-voltage DC (e.g., $+/-270$ $V_{DC}$ or 540-800 $V_{DC}$) at supply output 40. However, in the first operational mode, the loads on high-voltage AC power bus 27 are effectively disconnected from the universal power converter 15, which makes all of the DC power from the interleaved full-bridge converter 55 available at supply output 40 to high-voltage DC power bus 43. The interleaved inverter 70 may be directed by the control system 80 to effectively discontinue all but the most minor power generation activities in the first operational mode.

In a second operational mode, the aircraft power system is configured so that the universal power converter 15 supplies the low-voltage DC (e.g., 32 $V_{DC}$) at supply output 30 and high-voltage AC (e.g., 230 $V_{AC}$ or 115 $V_{AC}$, single-phase or three-phase) at supply output 25. However, in the second operational mode the loads on high-voltage DC power bus 43 are effectively disconnected from the universal power converter 15, which makes all of the DC power from the interleaved full-bridge converter 55 available to the interleaved inverter 70 for conversion to high-voltage AC for provision on high-voltage AC power bus 27. In this configuration, an intermediate high-voltage DC converter is not needed to provide input power to the interleaved inverter 70, reducing both the complexity and weight of the universal power converter 15.

Figure 5:
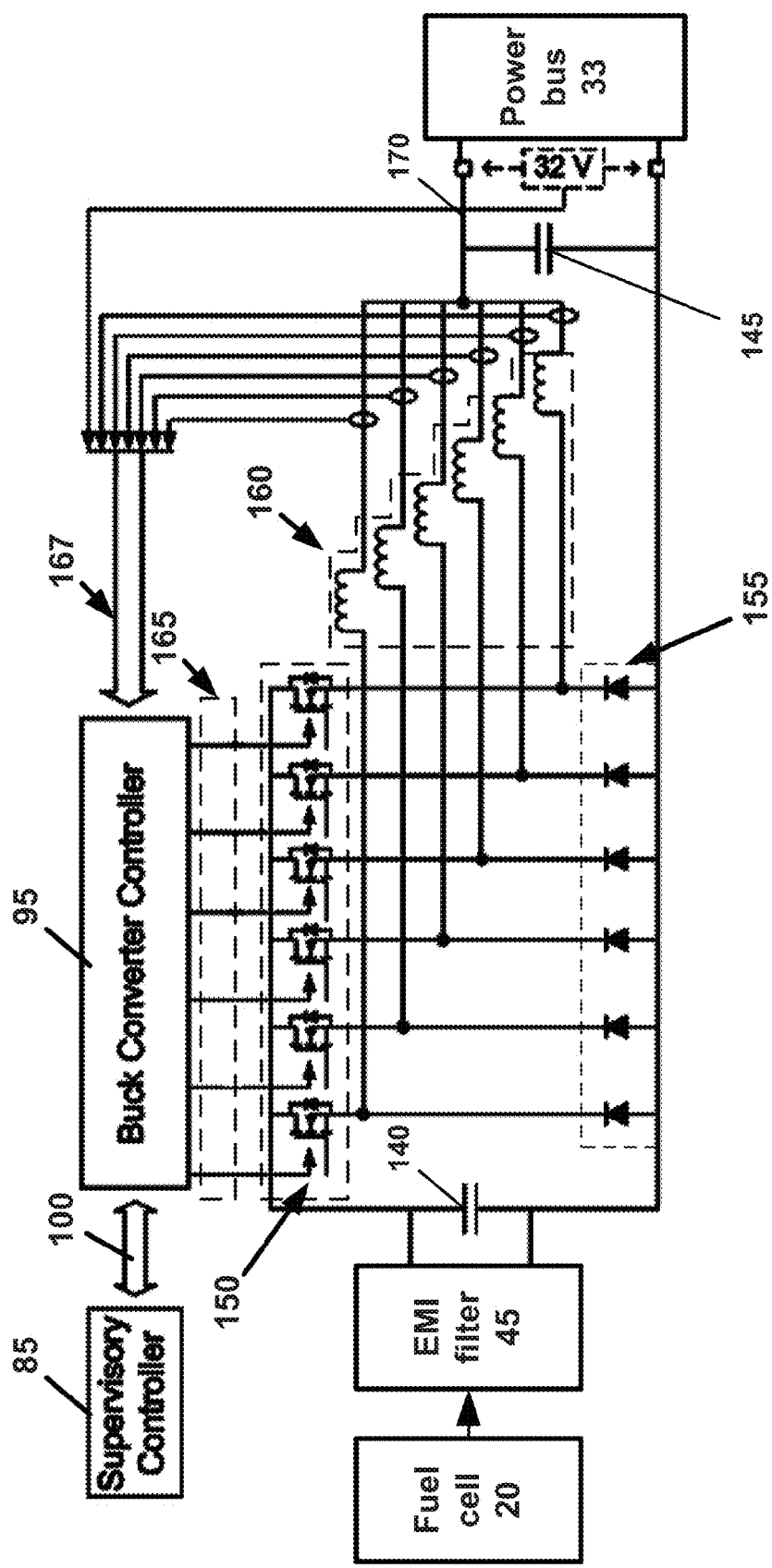
FIG. 5 shows one embodiment of a buck converter circuit topology that may be used in the universal power converter of FIG. 2.

FIG. 5 shows one embodiment of a buck converter circuit topology having parallel connected buck converters. The plurality of parallel connected buck converters provide a corresponding plurality of voltage phases numbering X to an output capacitor. The control system drives the plurality of buck converters so that the plurality of voltage phases are interleaved at 360/X degrees with respect to one another.

In this example, six buck converters are connected in parallel and share a common input capacitor 140 and common output capacitor 145. Each buck converter has a MOSFET (each MOSFET shown in MOSFET group 150), a diode (each diode shown in diode group 155), and a dedicated inductor (each dedicated inductor shown in inductor group 160). The inductors 160 are connected to a common node 170 at the output of the circuit. The current output of each of the inductor is monitored by a respective current sensor, which provides its phase current measurement to the control bus 167 of the buck converter controller 95. A voltage corresponding to the output voltage of the buck converter is also provided to the input of the buck converter controller 95 on the control bus 167.

The phase currents, output voltage, and control signals along communication path 100 are used by the buck converter controller 95 to generate the PWM control signals 165, where each control signal is associated with a respective buck converter. The six phases are interleaved at 60 degrees to reduce the input and output current ripple. This arrangement also decreases the current and thermal stresses on the MOSFET devices. In an aircraft system, the low-voltage DC output is a regulated at 32 $V_{DC}$, with current sharing control for all of the six phases.

Figure 6:
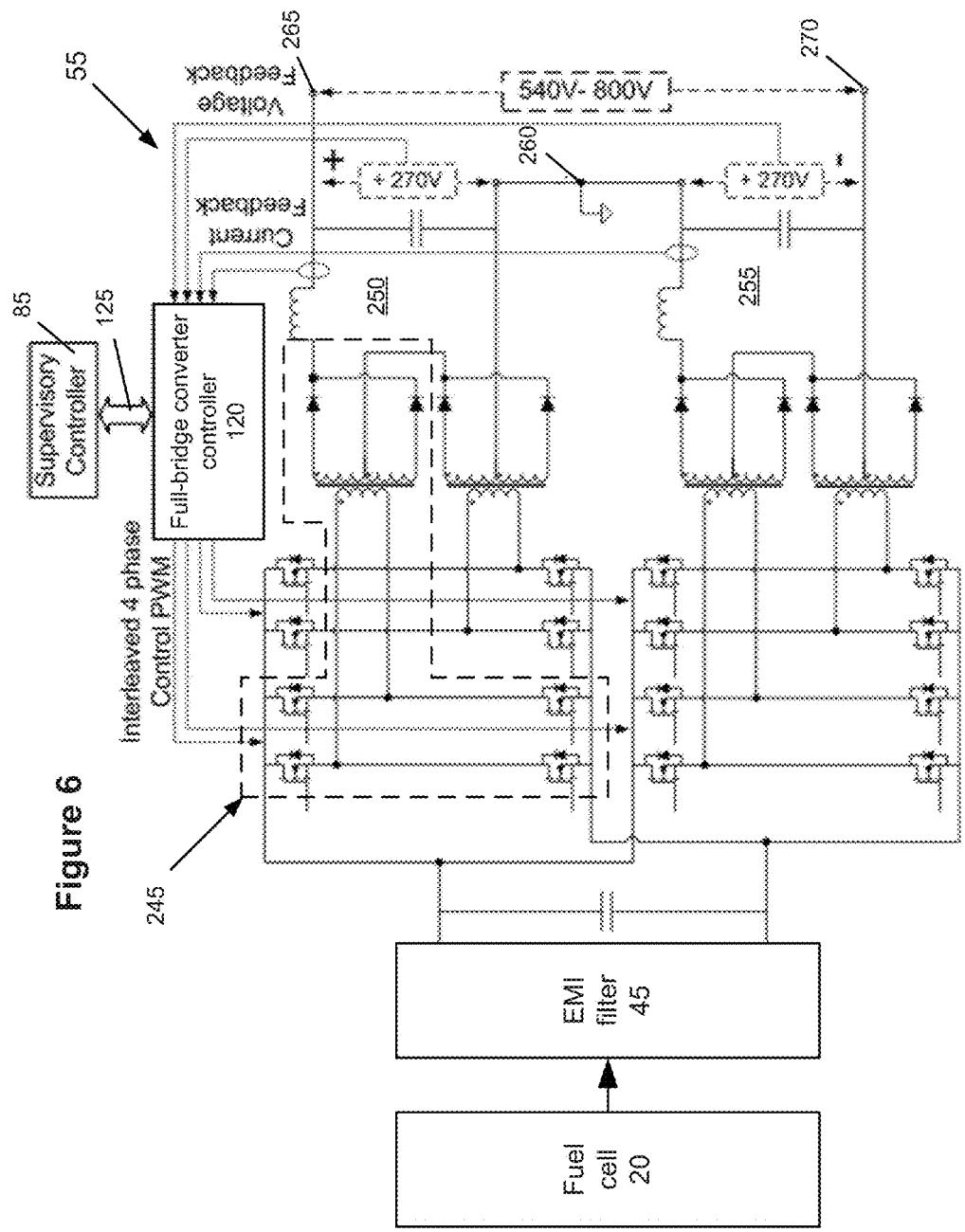
FIG. 6 shows one embodiment of an interleaved full-bridge converter topology that may be used in the universal power converter of FIG. 2.

FIG. 6 shows one embodiment of the interleaved full-bridge converter topology having a plurality of flow-bridge cells, wherein each full-bridge cell generates a respective phase voltage for rectification by a respective rectification circuit. In this example, the converter is a three-phase, four-leg interleaved inverter converter topology that includes four full-bridge cells and two sets of filters 250 and 255. One of the four full-bridge cells is enclosed by dotted lines and designated by reference 245. Each full-bridge cell includes four MOSFETs, one high frequency transformer, and two rectifier diodes. The full-bridge converter controller 120 generates interleaved PWM control signals to drive the four full-bridge cells. The PWM control signals are generated by the full-bridge converter controller number 120 in response to control signals provided by the supervisory controller 85, current feedback signals provided by current sensors disposed at the output of each filter 250 and 255, and voltage feedback signals corresponding to the voltages across the output of each filter 250 and 255.

All four phases of the full-bridge cells are connected in parallel at their input side to EMI filter 45. The phases are interleaved at 45° to minimize the input current ripple drawing from the fuel cell 20. The outputs of the phases are connected in series to promote even current sharing between phases.

In FIG. 6, two of the full-bridge cells are interleaved at 90° to generate a +270 $V_{DC}$ output, while the other two full-bridge cells are also interleaved at 90° with respect to one another to generate a −270 $V_{DC}$ output. The outputs are connected in series to double the output voltage, minimize output voltage ripple, and share current evenly. In operation, +/−270 $V_{DC}$ is generated with respect to a common node 260. At the direction of the supervisory controller 85, the full-bridge converter controller 120 may also control the operation of the full-bridge cells to generate high-voltage DC between end nodes 265 and 270 having a voltage level between about 540-800 $V_{DC}$.

Figure 7:
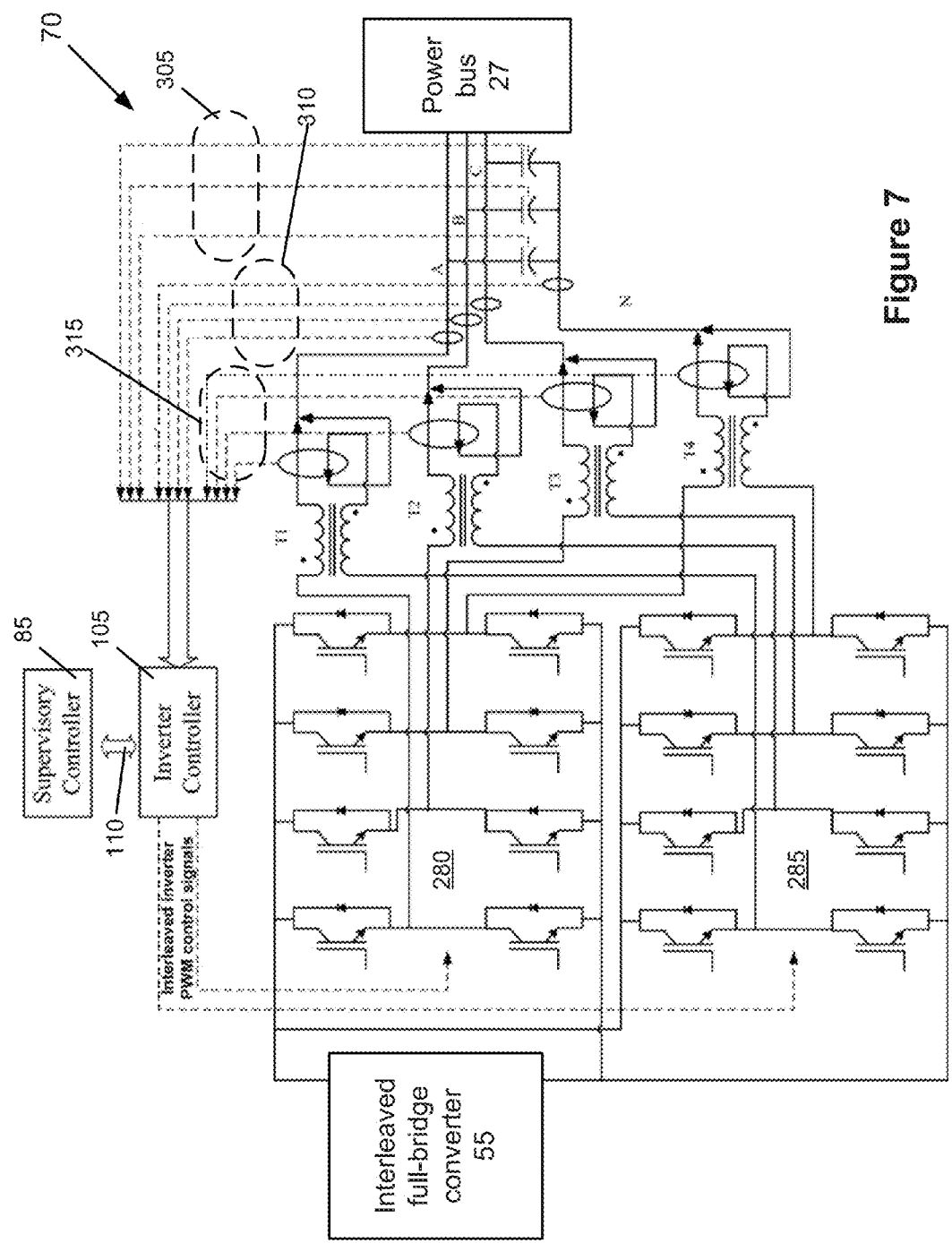
FIG. 7 shows one embodiment of an interleaved inverter circuit topology that may be used in the universal power converter of FIG. 2.

FIG. 7 shows one embodiment of an interleaved inverter circuit topology. In this example, the interleaved inverter 70 receives input power from the interleaved full-bridge converter 55. The input power provided from the full-bridge converter 55 may have a voltage level between about 540-800 $V_{DC}$. Here, the interleaved inverter 70 converts the high-voltage DC from the full-bridge converter 55 to three-phase high-voltage AC having a voltage level of about 230 $V_{AC}$ phase-to-neutral voltage at approximately 400 Hz.

The interleaved inverter topology includes two switch banks 280 and 285, four intercell transformers T1-T4, and three filter capacitor banks. Each switch bank includes four half-bridge legs. The PWM control signals driving the switch banks are interleaved at 180°. The same phases of the two switch banks 280 and 285 are paralleled through corresponding intercell transformers T1-T4.

The inverter controller 105 generates the PWM control signals based on the control signals received from the supervisory controller 85 along communication bus 110. The inverter controller also generates the PWM control signals in response to: 1) phase-to-neutral voltage feedback provided along lines 305; 2) phase current feedback provided along lines 310; and 3) differential current feedback along lines 315. Corresponding current sensors associated with each of the intercell transformers T1-T4

Figure 8:
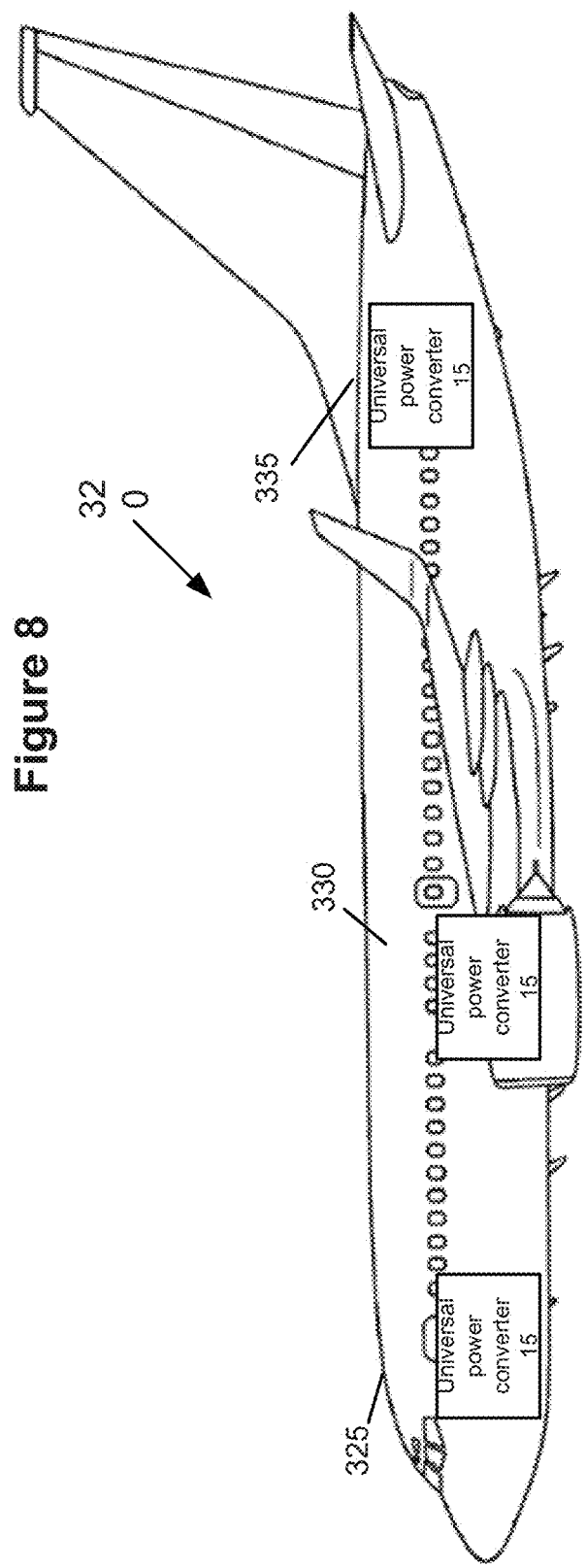
FIG. 8 provides examples of where the universal power converter may be placed in an aircraft.

FIG. 8 provides examples of where the universal power converter 15 may be placed in an aircraft 320 for use in an aircraft power supply system that provides regulated aircraft supply voltages. Here, three locations for the universal power converter 15 are shown: 1) the forward portion 325 of the aircraft 320 proximate, for example, the cockpit; 2) the mid-portion 330 of aircraft 320 proximate the engines/wings; and 3) the aft portion 335 of the aircraft 325 proximate, for example, the APU. A single universal power converter 15 may be placed at any one of these locations, or multiple universal power converters may be placed at more than one of these locations. Other locations are likewise suitable depending on the design of the aircraft 320. The interleaved buck converter, the interleaved full-bridge converter, and the interleaved inverter may be configured as a unitary unit that is localized at any of these locations. Additionally, or in the alternative, the interleaved buck converter, 9interleaved full-bridge converter, and the interleaved inverter may be distributed as separate units throughout the aircraft 320.

The invention claimed is:

1. An aircraft power supply system comprising:
   a plurality of system control signals;
   a low-voltage DC power bus configured to distribute low-voltage DC power to the aircraft;
   a high-voltage DC power bus configured to distribute high-voltage DC power to the aircraft;
   a high-voltage AC power bus configured to distribute high-voltage AC power to the aircraft;
   an unregulated DC power source;
   an interleaved buck converter configured to use power of the unregulated DC power source to generate a regulated low-voltage DC output for provision to the low-voltage DC power bus;
   an interleaved full-bridge converter configured to use power of the unregulated DC power source to generate a high-voltage DC output for provision to the high-voltage DC power bus;
   an interleaved inverter configured to use power of the unregulated DC power source to generate a high-voltage AC output on the high-voltage AC power bus; and a control system configured to control the interleaved buck converter, the interleaved full-bridge converter, and the interleaved inverter, in response to the plurality of system control signals.

2. The aircraft power supply system of claim 1, wherein the interleaved full-bridge converter is further configured to provide the high-voltage DC output as a power source for the interleaved inverter.

3. The aircraft power supply system of claim 1, wherein the control system comprises:
   a first controller configured to control the interleaved buck converter;
   a second controller configured to control the interleaved full-bridge converter;
   a third controller configured to control the interleaved inverter; and
   a supervisory controller responsive to the plurality of system control signals to control operation of the first, second, and third controllers.

4. The aircraft power supply system of claim 1, wherein the unregulated DC power source comprises a fuel cell.

5. The aircraft power supply system of claim 4, wherein the fuel cell provides unregulated DC output power to an EMI filter.

6. The aircraft power supply system of claim 5, wherein the EMI filter is common to both the interleaved buck converter and the interleaved full-bridge converter.

7. The aircraft power supply system of claim 1, wherein the interleaved buck converter, the interleaved full-bridge converter, and the interleaved inverter are configured as a unitary unit that is localized in an aft portion of the aircraft, a forward portion of the aircraft, or a mid-portion of the aircraft.

8. The aircraft power supply system of claim 1, wherein the control system is further configured to operate the interleaved full-bridge converter to turn the high-voltage DC output on and off.

9. The aircraft power supply system of claim 1, wherein the interleaved buck converter comprises:
   a plurality of parallel connected buck converters providing a corresponding plurality of voltage phases numbering X to an output capacitor; and
   wherein the control system drives the plurality of buck converters so that the plurality of voltage phases are interleaved at 360/X degrees with respect to one another.

10. The aircraft power supply system of claim 1, wherein the interleaved full-bridge converter comprises:
    a plurality of full-bridge cells configured to receive respective PWM control signals, wherein each full-bridge cell generates a respective phase voltage for rectification by a respective rectification circuit,
    a first filter circuit, wherein a first pair of the full-bridge cells are connected in parallel with the first filter circuit; and
    a second filter circuit, wherein a second pair of the full-bridge cells are connected in parallel with the second filter circuit, wherein the first and second filters are connected in series with one another and have a common node.

11. The aircraft power supply system of claim 1, wherein the interleaved inverter comprises a three-phase, four-leg interleaved inverter.

12. The aircraft power supply system of claim 1, wherein the low-voltage DC power bus provides a voltage of 32 $V_{DC}$ to the aircraft, the high-voltage DC power bus provides a voltage of +/−270 $V_{DC}$ and/or 540 $V_{DC}$ 800 $V_{DC}$ to the aircraft, and the high-voltage AC power bus provides a voltage of 230 or 115 $V_{AC}$ to the aircraft.

13. A control system for a power supply comprising:
    a first controller configured to control an interleaved buck converter;
    a second controller configured to control an interleaved full-bridge converter;
    a third controller configured to control an interleaved inverter; and
    a supervisory controller configured to control operation of the first, second, and third controllers in response to a plurality of control signals.

14. The control system of claim 13, wherein the supervisory controller is configured to direct the interleaved full-bridge converter to discontinue generation of high-voltage AC in a first operational mode and to direct the interleaved full-bridge converter to generate high-voltage AC in a second operational mode.

15. The control system of claim 13, wherein:
    the interleaved buck converter is configured to use power of an unregulated DC power source to generate a regulated low-voltage DC output for provision to a low-voltage DC power bus;
    the interleaved full-bridge converter is configured to use power of the unregulated DC power source to generate a high-voltage DC output for provision to a high-voltage DC power bus; and
    the interleaved inverter is configured to use power of the unregulated DC power source to generate a high-voltage AC output on a high-voltage AC power bus.

16. The control system of claim 13, wherein the first controller is configured to generate PWM control signals to control the interleaved buck converter.

17. The control system of claim 13, wherein the second controller is configured to generate PWM control signals to control the interleaved full-bridge converter.

18. The control system of claim 13, wherein the third controller is configured to generate PWM control signals to control the interleaved inverter.

19. A method for generating a plurality of regulated supply voltages, the method comprising:
    generating regulated low-voltage DC using power provided by a DC power source, wherein the regulated low-voltage DC is generated using an interleaved buck converter, and the DC power source is an unregulated DC power source;
    generating regulated high-voltage AC using power provided by the DC power source, wherein the regulated high-voltage AC is generated using an interleaved inverter;
    generating regulated high-voltage DC using power provided by the DC power source, wherein the regulated high-voltage DC is generated using an interleaved full-bridge converter; and
    controlling the interleaved buck converter, the interleaved full-bridge converter, and the interleaved inverter in response to a plurality of system control signals.

20. The method of claim 19, wherein the DC power source comprises a fuel cell.

* * * * *

UNITED STATES PATENT AND TRADEMARK OFFICE
CERTIFICATE OF CORRECTION

Page 1 of 1

PATENT NO. : 10,476,379 B2
APPLICATION NO. : 15/359400
DATED : November 12, 2019
INVENTOR(S) : Karimi et al.

It is certified that error appears in the above-identified patent and that said Letters Patent is hereby corrected as shown below:

In the Claims

Column 8, Line 4 In Claim 12:
and/or 540 $V_{DC}$ 800 $V_{DC}$

Should read:
and/or 540 $V_{DC}$ – 800 $V_{DC}$

Signed and Sealed this
Ninth Day of June, 2020

Andrei Iancu
*Director of the United States Patent and Trademark Office*